United States Patent [19]
Morita

[11] Patent Number: 5,798,029
[45] Date of Patent: Aug. 25, 1998

[54] TARGET FOR SPUTTERING EQUIPMENT

[75] Inventor: Katsumi Morita, Matsudo, Japan

[73] Assignee: Applied Materials, Inc., Santa Clara, Calif.

[21] Appl. No.: 777,114

[22] Filed: Dec. 30, 1996

Related U.S. Application Data

[63] Continuation of Ser. No. 498,646, Jul. 6, 1995, which is a continuation of Ser. No. 231,606, Apr. 22, 1994, abandoned.

[51] Int. Cl.$^6$ ............................. C23C 14/34; C23C 14/40
[52] U.S. Cl. ........................ 204/298.16; 204/298.07; 204/298.08; 204/298.12; 204/298.18; 204/298.2; 204/298.23; 204/298.28
[58] Field of Search ........................ 204/298.07, 298.08, 204/298.12, 298.16, 298.17, 298.18, 298.19, 298.2, 298.23, 298.26, 298.28

[56] References Cited

U.S. PATENT DOCUMENTS

| | | | |
|---|---|---|---|
| 3,616,402 | 10/1971 | Kumagai | 204/298.12 |
| 4,006,070 | 2/1977 | King et al. | 204/298.07 |
| 4,401,546 | 8/1983 | Nakamura et al. | 204/298.12 |
| 4,412,907 | 11/1983 | Ito et al. | 204/298.12 |
| 4,622,121 | 11/1986 | Wegmann et al. | 204/298.18 |
| 4,879,017 | 11/1989 | Lee | 204/298.12 |
| 4,880,515 | 11/1989 | Yoshikawa et al. | 204/192.15 |
| 5,114,556 | 5/1992 | Lamont, Jr. | 204/298.08 |
| 5,196,105 | 3/1993 | Feuerstein et al. | 204/298.19 |

FOREIGN PATENT DOCUMENTS

| | | | |
|---|---|---|---|
| 64-75669 | 3/1989 | Japan | 204/298.07 |
| 2096177 | 10/1982 | United Kingdom | 204/298.16 |

*Primary Examiner*—R. Bruce Breneman
*Assistant Examiner*—Rodney G. McDonald
*Attorney, Agent, or Firm*—Donald Verplancken; Raymond R. Moser

[57] ABSTRACT

In sputtering equipment, a pair of targets are positioned in spaced apart relation defining a space therebetween. Each of the targets forms an electrode that is connected to a voltage supply unit. The voltage generates an electric field between the target pair. Furthermore, a process gas is supplied to the space between the targets. As the gas flows through this space, the electric field excites the gas into a plasma state. The plasma, being proximate the targets, causes the material comprising the targets to be sputtered. Additionally, to increase the plasma density in the space between the targets, a magnetic field is applied orthogonally to the electric field. A substrate, upon which the target material is sputtered, is positioned within the sputtering equipment opposite the targets. Further, because the target surfaces from which the material is sputtered are not parallel to the substrate, sputtered particles strike the substrate from an oblique angle. Such oblique striking angles produce a thin film upon the substrate having improved step coverage.

16 Claims, 5 Drawing Sheets

TARGET FOR SPUTTERING EQUIPMENT

CROSS REFERENCE TO RELATED APPLICATION

This application is a continuation of patent application Ser. No. 08/498,646 filed Jul. 6, 1995 entitled TARGET FOR SPUTTERING EQUIPMENT, which is a file wrapper continuing patent application of prior application Ser. No. 08/231,606, filed on Apr. 22, 1994, now abandoned, and also entitled TARGET FOR SPUTTERING EQUIPMENT.

BACKGROUND OF THE DISCLOSURE

1. Field of the Invention

The invention relates to sputtering equipment and, more particularly, to a target within sputtering equipment.

2. Description of the Prior Art

Typical sputtering equipment includes a vacuum chamber, a target containing the material to be sputtered, a process gas source that provides a process gas to the vacuum chamber and equipment to generate an electric field. Additionally, a substrate is positioned upon a susceptor within the vacuum chamber. The electric field generating equipment is connected to both the susceptor and target such that an electric field is generated therebetween. In operation, the electric field ionizes the process gas, i.e., the electric field generates a plasma between the target and the susceptor, and accelerates the ionized gas atoms towards the target. As a result, the ionized gas atoms impact the target and dislodge particles (atoms) from the target material, i.e., the target material becomes a gas. Once free from the target, these dislodged particles eventually deposit themselves upon the substrate as a so-called "thin-film".

To obtain high-quality deposition of the target material upon the substrate, existing sputtering techniques require a relatively high vacuum inside the vacuum chamber. Such a high vacuum increases the mean free path of dislodged target particles as these particles traverse the distance from the target to the substrate. The increased mean free path of the target particles reduces absorption of the process gas by the thin-film, thus improving the film quality, i.e., less impurities (process gas particles) are present in the film. However, an increased mean free path impedes a stable generation of plasma, and reduces the number of ions that impact the target. The result is a decreased rate of film deposition.

A well-known technique employed to solve this problem, called the magnetron sputtering method, employs equipment that generates a magnetic field orthogonally oriented with respect to a conventionally generated electric field. Such a magnetic field exploits cycloid motion of electrons within the electric field to increase the plasma density proximate the target. As a result of employing this magnetic field, an increased number of ion generating electrons remain proximate the target and, consequently, a greater number of process gas ions impact the target. An increased number of target impacts increases the rate of film deposition.

Most current sputtering equipment used for the semiconductor wafer processing are so-called parallel plate sputtering systems, as shown in FIG. 7. Specifically, in parallel plate sputtering system 800, a plurality of semiconductor wafers 804 are mounted to a wafer holder 802 that forms an electrode. A target 808, positioned in parallel, spaced apart relation to the wafer holder 802, forms a second electrode. By applying a voltage to the electrodes (typically a high-frequency AC voltage), an electric field is established therebetween, i.e., the field is formed in a space 816 defined by the electrodes. The electric field is confined to space 816 by a shield 806. As a result of generating the electric field, process gas, present in space 816, becomes a plasma. To increase the plasma density near the target 808, a plurality of magnets 810 are positioned beneath the target. As such, the magnets generate a magnetic field (shown as arrows 814) above the target and within the space 816. The magnetic field increases the plasma density near the target and, consequently, increases the sputtering rate. To prevent the target from overheating and becoming damaged, a coolant is provided to the underside of the target via conduits 812. However, as is well known in the art, producing a uniform magnetic field proximate and parallel to the target in parallel-plate sputtering equipment presents considerable difficulties. Consequently, the magnet is alternatively arranged (as indicated in FIG. 8) in such a way that plasma is generated above the target in a ring form (annular).

Specifically, FIG. 8 depicts a planar target 810 beneath which magnets (not shown) are positioned having their poles aligned as indicated by "N" and "S" in the figure. In particular, the magnet produces north poles (N) along all four edges 904 of the target and a south pole (S) in the center 906 of the target. As such, the magnetic field above the target has an annular shape with magnetic lines of force directed as shown by arrows 814. As a result of this magnet arrangement, the electrons move with cycloid motion near the target surface, e.g., shown as arrow 900. As such, the electron density near the target surface is increased within the magnetic field and, consequently, the plasma density is also increased.

A shortcoming of conventional planar target magnetron sputtering systems such as those in FIGS. 7 and 8 is that sputtering of the target material occurs primarily in the annular region. Therefore, even on a target with a large surface area, sputtering occurs only from a relatively small portion of the target. Thus, the percentage of target utilization is relatively low. Another problem with this target arrangement is that as the target is consumed by the sputtering process, film deposition uniformity decreases. A further shortcoming shared in various degrees by conventional sputtering systems is that sputtered particles travel from the target to the wafer along trajectories which are mostly perpendicular to the wafer. If most of the particles trajectories which are perpendicular to the wafer, the film deposited on the wafer may have poor coverage, that is, poor or uneven coverage of the sidewalls and gaps between steps (i.e., raised features) on the wafer. Commonly assigned U.S. patent application Ser. No. 08/023,472 filed Feb. 25, 1993 by Avi Tepman, hereby incorporated by reference into the present application, describes the distribution of trajectory angles of sputtered particles and a novel apparatus for optimizing such distribution to improve step coverage of the deposited film.

This phenomenon is best understood using an illustration. FIG. 9(a) depicts a cross-sectional view of a wafer 1000 having a step 1002 therein. FIG. 9(b) depicts target particles, represented by arrows 1004, impacting the wafer 1000 as if sputtered from a target such as that shown in FIG. 8. As a result of the target particles in FIG. 9 perpendicularly impacting the wafer, the particles are scattered by the edges of the step 1004. Ultimately, such scattering produces a film profile that is indented near the step. FIG. 9(c) depicts a cross-sectional view of such an indented film 1006. Thus, the existing sputtering apparatus tends to produce a thinner film proximate step-shaped portions of the wafer. Such a step coverage imperfection may lead to wire ruptures and other semiconductor processing flaws.

SUMMARY OF THE INVENTION

The present invention is a method and apparatus for sputtering material from a target onto a semiconductor substrate. The invention allows a higher proportion of the target surface to be utilized, and it allows good step coverage to be achieved even when depositing films on densely stepped topographies of large substrates.

More specifically, the sputtering apparatus of the present invention comprises one or more pairs of targets between which a voltage is applied, preferably by an RF power supply. Each of the two targets of a pair has a surface composed of the material to be sputtered, and the respective surfaces of the two targets face each other on opposite sides of an imaginary plane which is perpendicular to the substrate. The two surfaces may be parallel flat surfaces, but more preferably they are non-parallel flat or curved surfaces which diverge toward their ends which are closest to the substrate. For example, in the preferred embodiment the two targets are two long, parallel bars, respectively, each bar having its longitudinal axis parallel to the substrate, and each bar having its transverse section shaped like a triangle (or trapezoid) whose major base is parallel to the substrate and whose apex (or minor base) points toward the substrate.

In operation, a process gas is supplied to the region between the two opposing targets, and the voltage between the targets excites the gas to a plasma state. Ions from the plasma sputter material off the targets. (Preferably, a magnet produces a magnetic field perpendicular to the electric field between the opposing targets so as to increase the density of the ions).

Because the target surfaces are at an angle to the surface of the wafer, a large proportion of the sputtered material strikes the wafer at oblique angles, thereby depositing a film with superior step coverage.

Essentially the entire opposing surfaces of a target pair can be sputtered, in contrast with conventional magnetron sputtering systems having circular targets which concentrate the sputtering in annular grooves, thereby wasting expensive target material outside the grooves.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the FIGURES.

DETAILED DESCRIPTION

Figure 1:
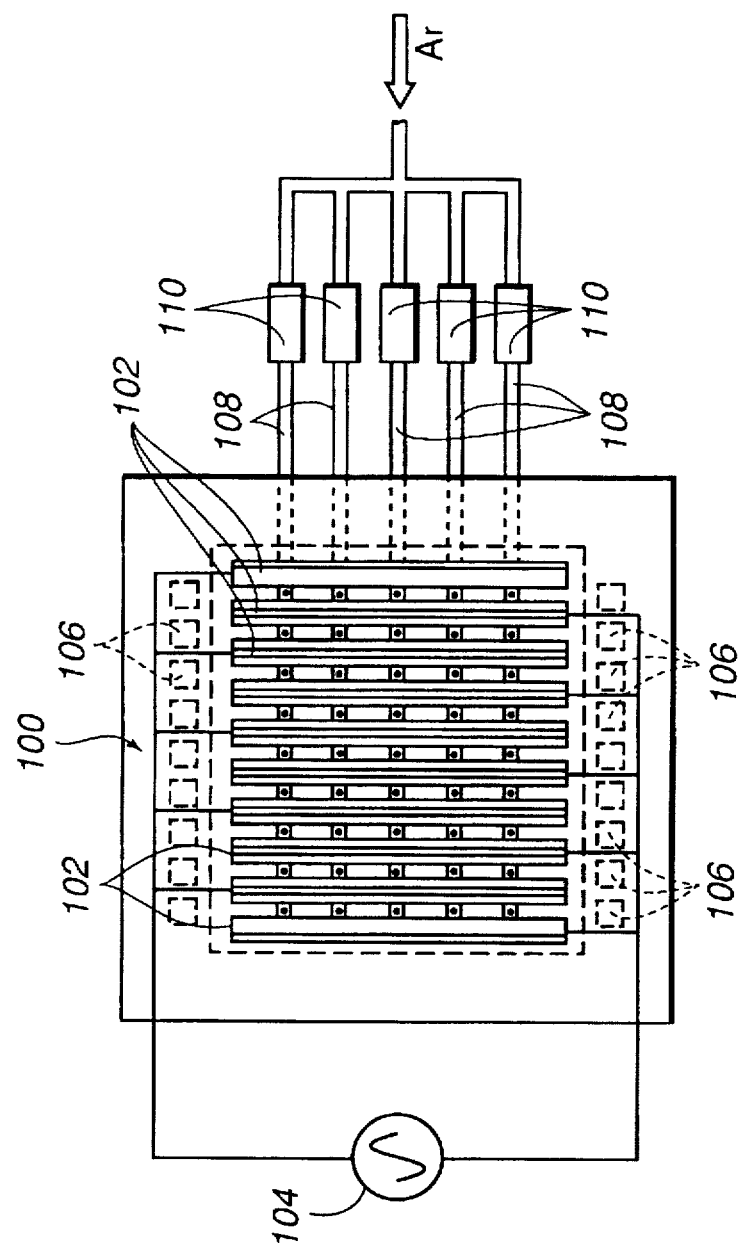
FIG. 1 is a bottom view, planar layout diagram showing targets in the sputtering equipment of the present invention.
Figure 2:
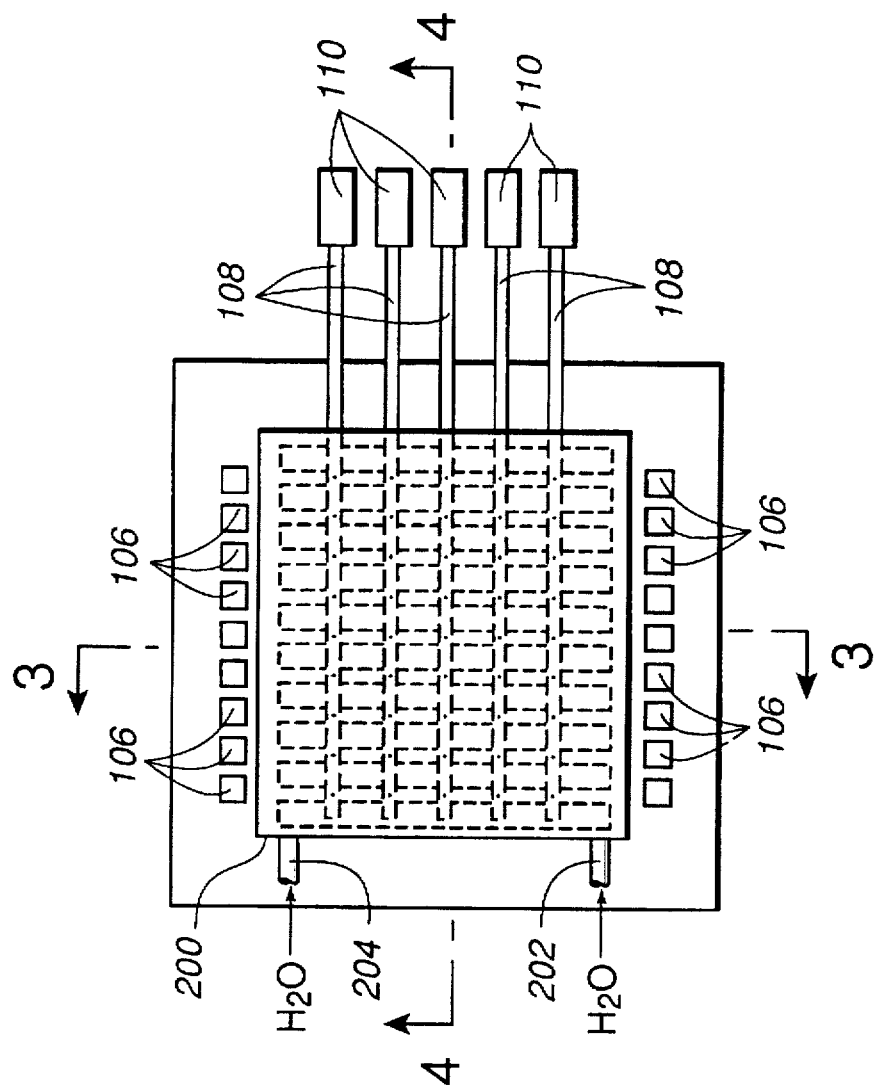
FIG. 2 is a top view of the targets shown in FIG. 1.
Figure 3:
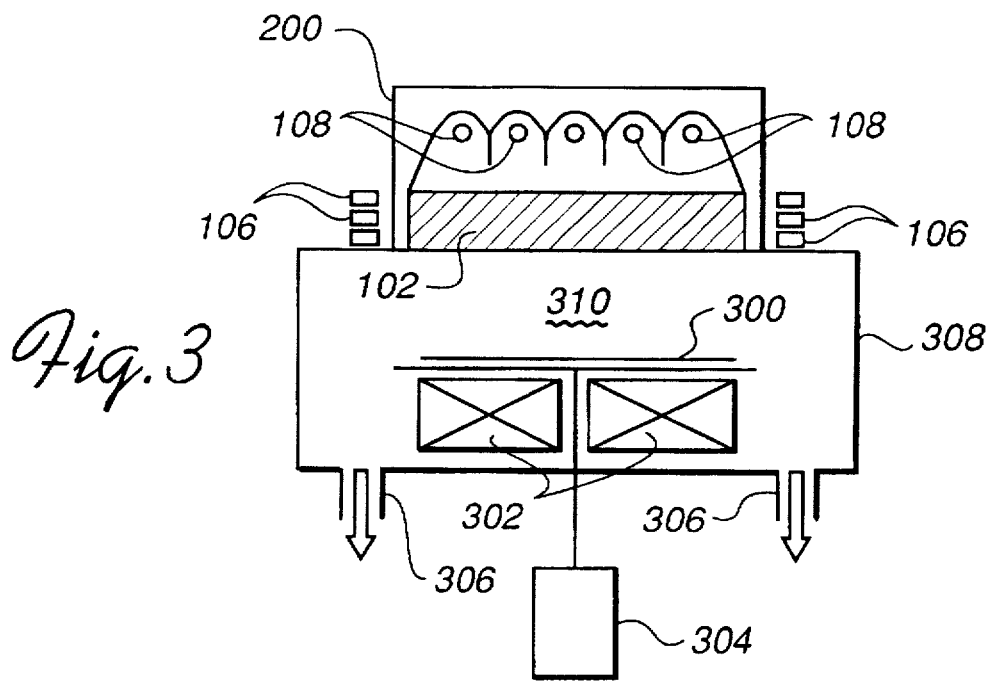
FIG. 3 is a cross-sectional view of the sputtering equipment as viewed along line 3—3 in FIG. 2.
Figure 4:
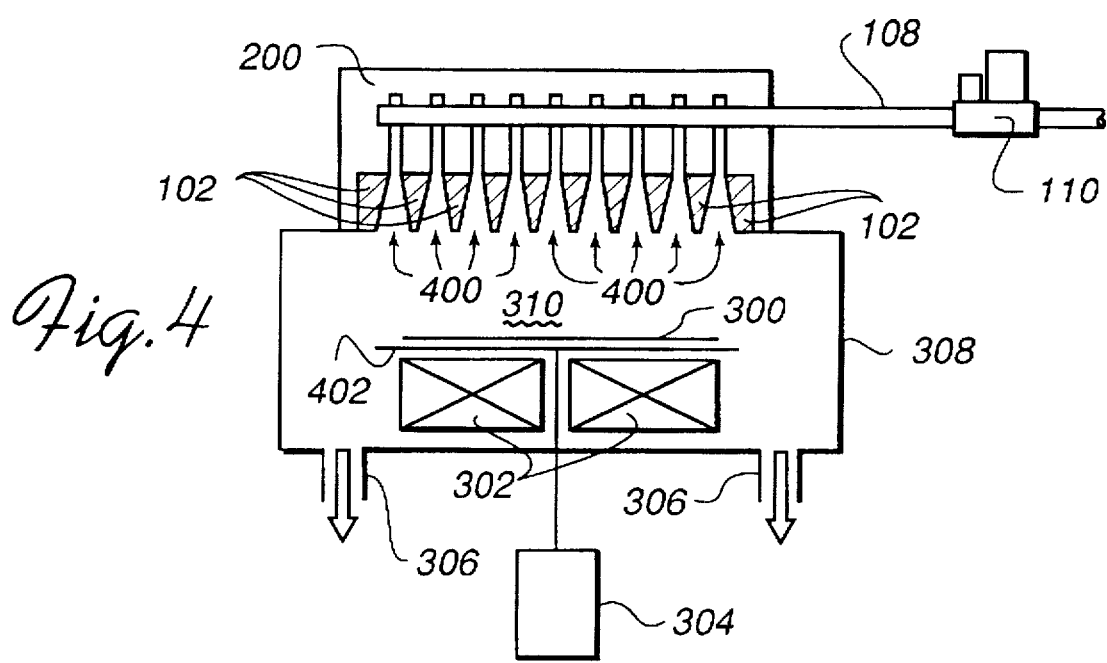
FIG. 4 is a cross-sectional view of the sputtering equipment as viewed along line 4—4 in FIG. 2.
Figure 5:
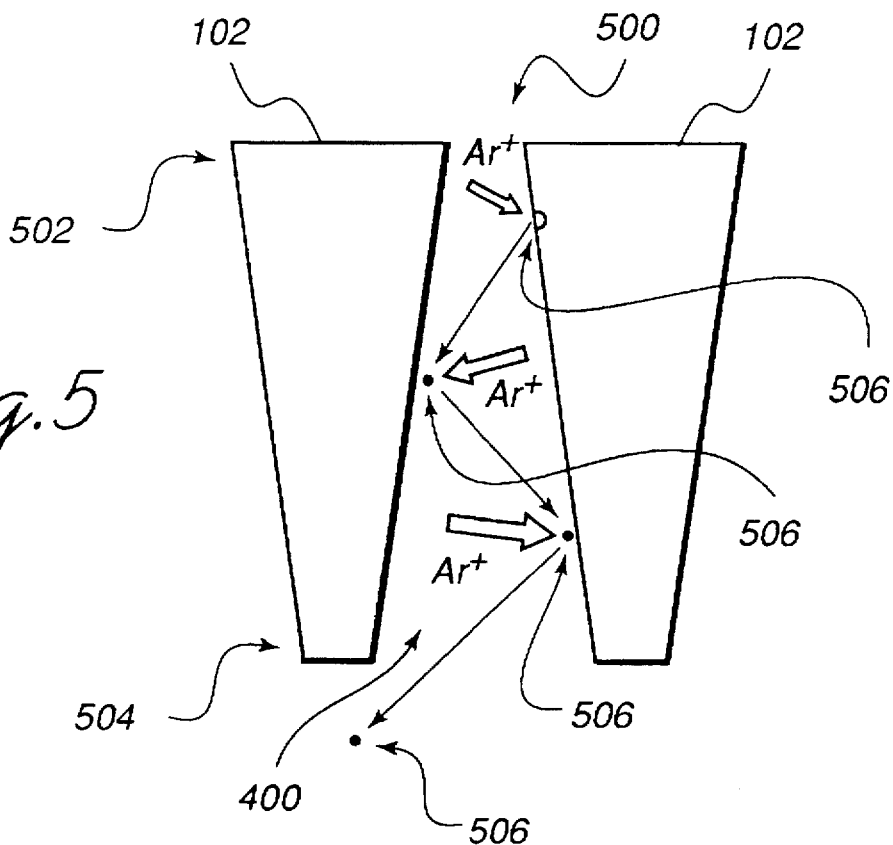
FIG. 5 depicts particles moving in a space between a pair of the targets shown in FIG. 1.

FIGS. 1 through 5 depict a preferred embodiment of the invention as used within sputtering equipment. FIG. 1 depicts a plurality of targets within a vacuum chamber as viewed from below, i.e., from a substrate that is the object of the sputtering process. FIG. 2 is a top view of the equipment shown in FIG. 1. FIGS. 3 and 4 depict FIG. 2 as viewed along lines A—A and B—B, respectively. FIG. 5 depicts a cross-sectional view of a target pair. To best understand the invention, the reader should simultaneously consult FIGS. 1, 2, 3, 4 and 5 while reading the following description of the invention.

The sputtering equipment, shown in FIGS. 1 through 4, consists of the following: a target unit 100 positioned in a vacuum chamber 308, a susceptor 402, a cooling device 200, a heater 302, a high-frequency power supply unit 104, and a magnetic-field generator 106. The target unit 100 is composed of one or more pairs of targets 102 between which a voltage is applied from power supply unit 104. More specifically, target unit 100 comprises one or more pairs of targets between which a voltage is applied, preferably by an RF power supply. Each of the two targets of a target pair 500 has a surface composed of the material to be sputtered, and the respective surfaces of the two targets face each other on opposite sides of an imaginary plane which is perpendicular to a substrate 300 mounted on the susceptor 402. The two surfaces may be parallel flat surfaces, but more preferably they are non-parallel flat or curved surfaces which diverge toward their ends which are closest to the substrate 300. For example, in the preferred embodiment the two targets are two long, parallel bars, respectively, each bar having its longitudinal axis parallel to the substrate, and each bar having its transverse section shaped like a triangle (or trapezoid) whose major base is parallel to the substrate and whose apex (or minor base) points toward the substrate.

As specifically shown in FIG. 5, each target has a polygonal cross-sectional shape. Each of the depicted targets have trapezoidal shapes such that a base end 502 is wider than a tip end 504 of each target. In other words, a space 400 between adjacent targets 100, i.e., a target pair 500, becomes larger as the targets extend toward a substrate 300 mounted upon susceptor 402 within vacuum chamber 308. Several pairs of these targets form the target unit 100.

Though the illustrative target is shown having a trapezoidal form, those skilled in the art will realize from the following disclosure that the targets may have any shape cross-section. For example, the targets could have triangular, rectangular or cylindrical cross-sectional shapes. In fact, the targets in a target unit could have a various shapes to tailor the sputtering deposition characteristics to a particular sputtering application.

In the vacuum chamber 308, the target unit 100 is attached to the water cooling means 200 in order to prevent overheating of the target unit. Typically, the cooling means is a volume of coolant that is in contact with a portion of the target unit. A plurality of dispersion tubes 108 placed over the targets supplies process gas to the space 400 between the targets. The process gas is supplied from a process gas supply (not shown) to the dispersion tubes 108 via gas flow regulator 110. The process gas is typically argon (Ar). However, in some sputtering applications may use other gases such as nitrogen ($N_2$) or oxygen ($O_2$).

The high-frequency power supply unit 104 supplies AC voltage to each individual target 102. In this manner, each target in a target pair serves as an electrode to which the AC voltage is applied. As such, an electric field is generated in the space 400 between the target pair 500. Consequently, the process gas flowing between the targets is ionized into a plasma state by the electric field. Because the voltage applied to each target 102 in the target pair 102 reverses polarity every half cycle and each target is identical in shape and form, no charge-up occurs on the target. Therefore, many different types of material, including semiconductors and insulators, in addition to conductors, can be used as a target material, i.e., the target is formed by coating a conductive electrode with the non-conductive or semiconductive sputtering material.

To enhance the plasma density, a magnet 106 is provided proximate the target unit 100, but outside the vacuum chamber 308. The purpose of this magnet is to generate a magnetic field orthogonal to the electric field located in the space between the targets. Thus, mutually orthogonal electric and magnetic fields can be created, and a high plasma density can be obtained by exploiting cycloid motion of the electrons near the surface of the targets.

As shown in FIG. 3, it is preferable that the magnet 106 be divided into three vertical sections. Each of these three sections is designed to produce a different magnitude of magnetic force. Specifically, the magnitude of top, middle, and bottom magnetic forces promote the migration of the target material along the target surface. To best assure material migration, the top magnet should have the strongest magnetic field, the middle magnet a lesser magnetic field and the bottom magnet the weakest magnetic field. The importance of material migration is discussed in detail below. For now, suffice it to say that such material migration ensures that the target material is used effectively and virtually totally. Obviously, the magnet can be divided into any number of sections, and is not limited to three sections. Additionally, the magnet can be one or more electromagnets. As such, the magnetic force generated by each electromagnet can be accurately controlled by circuitry that controls current through each electromagnet, e.g., top, middle, and bottom electromagnets. As such, the magnetic field strengths of the magnets can be dynamically varied to control target utilization.

During operation, the process gas flows along the targets from the top (base end) to the bottom (tip end) such that the gas flows perpendicularly to both the electric field and the magnetic field. This permits efficient ionization of the gas as it flows in the space between the targets. An appropriate adjustment of the gas flow from the dispersion tubes 5 makes it possible to optimize the plasma density at a desired location between the targets, thus optimizing sputtering efficiency and permitting fine adjustments of the uniformity of the film deposited upon the substrate.

To facilitate uniform and efficient formation of the thin-film upon the substrate, the susceptor 402 as well as the substrate 300 attached thereto is rotated by a rotation device 304. A conventional heater 302 for heating the substrate is provided in a lower portion of the susceptor. The vacuum chamber is maintained at a high vacuum by a conventional vacuum pump (not shown), which is connected to the vents 306.

The space 310 between the target unit 100 and the substrate 300 has a relatively large volume and is maintained at a high vacuum. In contrast, the gas density is relatively high in the space between individual targets 102. Consequently, the plasma density is maintained at a high level near the target unit, and sputtering efficiency of the apparatus is increased compared to conventional sputtering systems.

As indicated in FIG. 5, the space 400 between targets 102 increases or "fans out" in a direction toward the substrate. Therefore, although sputtering occurs along the entire surface of targets 102, only the surfaces near the tips 504 of the targets 102 contribute to the film formation on the wafer. Specifically, any particles that are sputtered from other portions of the targets, i.e., from the surface near the base end 502, are re-deposited on the targets. As such, particles 506 of target material is repeatedly sputtered from and then re-deposited on the target surface. The target material migrates along the target toward the tip, and ultimately the material leaves the target and is deposited on the wafer in the form of a film. Further, since the surface from which the particle is sputtered is not parallel to the substrate, most of the particles that are sputtered from the targets strike the substrate from an oblique angle. Deposition of the target material from an oblique angle improves film coverage of a step in the surface of the substrate.

Figure 6:
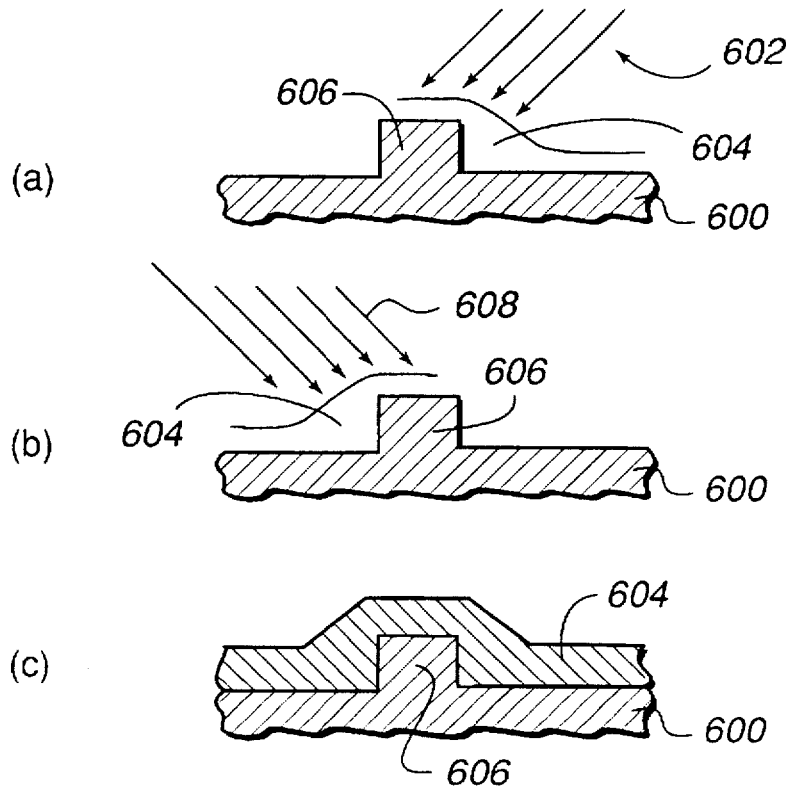
FIG. 6 depicts a film formed by applying the present invention to a wafer containing steps.
Figure 7:
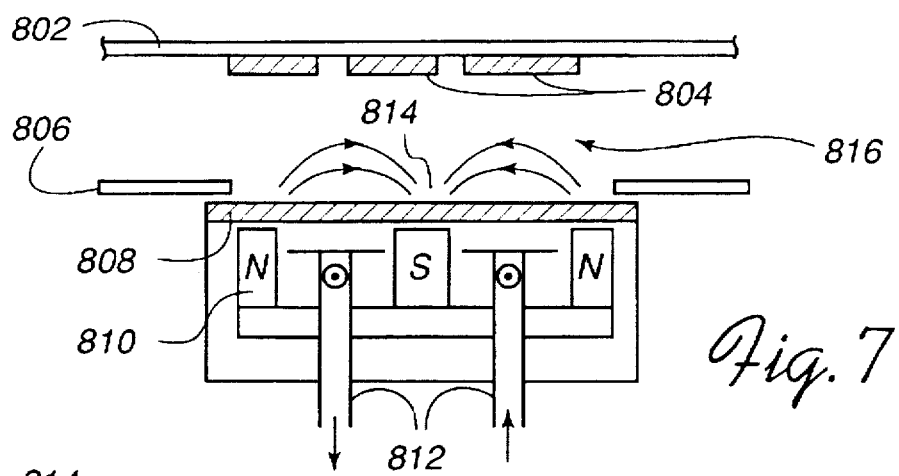
FIG. 7 depicts conventional parallel plate sputtering equipment.
Figure 8:
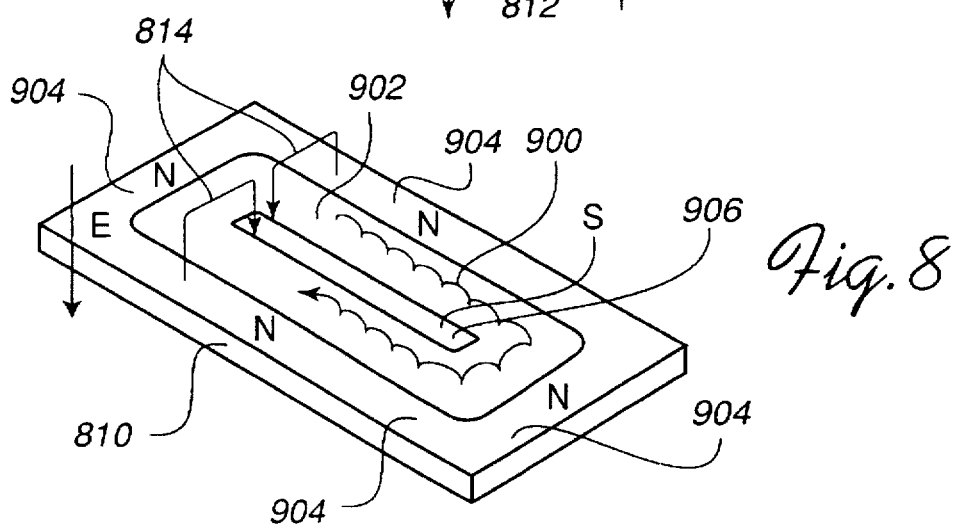
FIG. 8 depicts a sputtering region and a magnetic field distribution in a target in the equipment depicted in FIG. 8.
Figure 9:
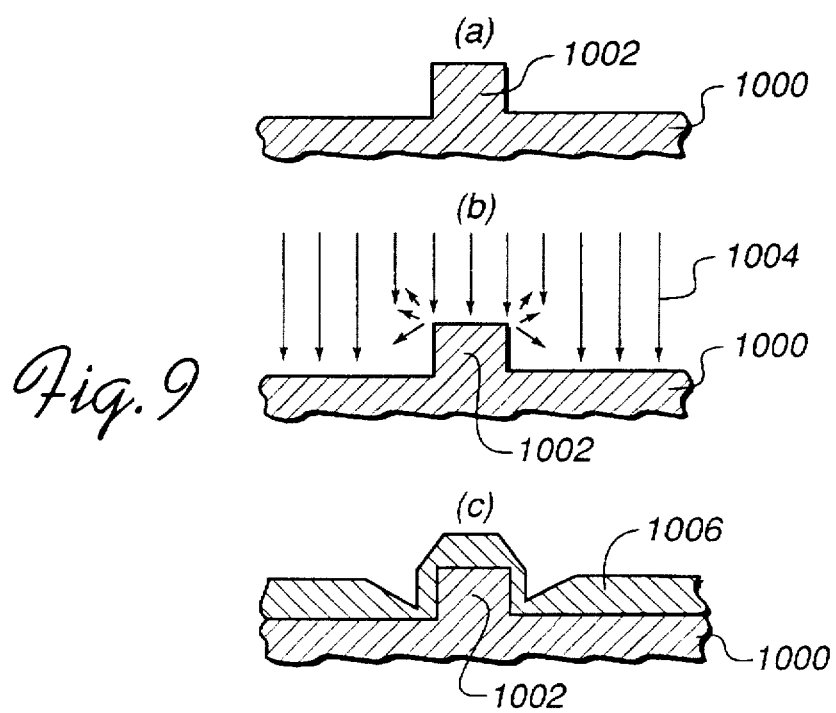
FIG. 9 depicts a film formed by using conventional sputtering equipment.

Specifically, FIG. 6(a) depicts a substrate 600 being impacted, at an oblique angle, by particles of target material (represented by arrows 602). As the particles impact the surface of the substrate 600, they cumulatively form a film 604. Due to the oblique angle of incidents, there is little scattering of the particles as they impact the step 606 in the surface of the substrate 600. As depicted in FIG. 6(b), other particles 608 arrive from the target unit at other oblique angles to further deposit a film 604 upon the substrate. Further, by rotating the substrate 600 by means of the susceptor rotation device, it is possible to achieve film formation with a high degree of step coverage over the entire substrate surface, as shown in FIG. 6(c).

Sputtering equipment utilizing the present invention permits the following: (1) creation of a high plasma density, and attainment of high sputtering efficiency, i.e., a high deposition rate, by maintaining a high gas density in the space between targets and by maintaining a high vacuum in the chamber; (2) effective utilization of the entire target surface for producing the film; (3) the ability to handle relatively large substrates; (4) improvements in step coverage due to the fact that sputtered particles strike the substrate from an oblique angle; (5) damage-free sputtering onto the substrate (little damage from plasma) due to the fact that the susceptor on which a substrate is mounted is not used as an electrode; and (6) the ability to use any material, including conductors, semiconductors, and insulators, as the thin-film deposition material.

Although one embodiment incorporating the teachings of the present invention has been shown and described in detail herein, those skilled in the art can readily devise many other varied embodiments that still incorporate these teachings.

What is claimed is:

1. Apparatus for sputtering material upon a substrate comprisings:

a vacuum chamber;

a target unit, contained in said vacuum chamber and positioned in a parallel spaced apart relation to said substrate, having a plurality of targets positioned in spaced apart relation to one another where opposing surfaces of said adjacent targets define a space between adjacent targets and where a longitudinal axis extends along each of said targets and each longitudinal axis is parallel to each other longitudinal axis and all the longitudinal axes lie in a single plane whereby the targets in said target unit form a planar array of targets;

an electric field generator, connected to each of said targets, for generating an electric field between adjacent targets that produces a plasma between said adjacent targets whereby material contained in each of said targets is sputtered from each target, said electric field is orthogonally aligned with the longitudinal axis of each of the adjacent targets; and a plurality of magnetic field generators, positioned at each end of said plurality of targets between said longitudinal axis of each of said adjacent targets, for generating a magnetic field having a magnetic field gradient within said space that promotes migration of the sputtered material toward said substrate, where said magnetic field is aligned perpendicular to a direction of said electric field within said space and parallel to said opposing surfaces of said adjacent targets, and where said magnetic field is located in the space between adjacent targets and is aligned parallel to the longitudinal axis of each of the adjacent targets to concentrate a plasma in said space between said adjacent targets and said magnetic field gradient is produced in a direction perpendicular to both the longitudinal axis of each of the targets and the direction of the electric field.

2. The apparatus of claim 1 wherein said electric field generator further comprises:

a voltage generator, connected to each of said targets in said target unit, for applying voltage thereto and for generating an electric field within said spaces between said adjacent targets;

a gas provider, connected to said vacuum chamber, for providing a gas to said vacuum chamber; and a conduit, connected to said gas provider, for channeling said gas to said spaces between said adjacent targets.

3. The apparatus of claim 1 wherein said magnetic field generators is a permanent magnet.

4. The apparatus of claim 1 wherein said magnetic field generators is an electromagnets.

5. The apparatus of claim 1 wherein each of said targets in said target unit have polygonal cross-sectional shapes.

6. The apparatus of claim 5 wherein each of said targets in said target unit have trapezoidal cross-sectional shapes such that a base end of each of said targets is wider than a tip end thereof.

7. The apparatus of claim 1 further comprising a susceptor, contained within said vacuum chamber, for mounting said substrate in spaced apart relation to said target unit.

8. The apparatus of claim 7 wherein said targets are parallel bars having said longitudinal axis parallel to said substrate and wherein each bar has a trapezoidal-shaped transverse section with a major base parallel to said substrate and a minor base nearest the substrate.

9. The apparatus of claim 8 wherein said minor base is shorter than said major base.

10. The apparatus of claim 7 wherein said susceptor further comprises a means for rotating said substrate.

11. The apparatus of claim 1 wherein each of said targets is coated with a non-conductive sputtering material.

12. The apparatus of claim 1 wherein each of said targets is coated with a semiconductive sputtering material.

13. The apparatus of claim 1 wherein said plurality of magnetic field generators are plurality of permanent magnets, where each permanent magnet forms a magnetic field having a different magnetic field strength from each other permanent magnetic and a combination of the magnetic fields from each of the permanent magnets produce said magnetic field gradient within said space to promote migration of the sputtered material toward said substrate.

14. The apparatus of claim 1 wherein said plurality of magnetic field generators are plurality of electromagnets, where each electromagnet forms a magnetic field having a different magnetic field from each other electromagnet and a combination of the magnetic fields from each of the electromagnets produce said magnetic field gradient within said space to promote migration of the sputtered material toward said substrate.

15. The apparatus of claim 14 wherein said plurality of electromagnets is controllable to produce an optimal magnetic field gradient.

16. The apparatus of claim 6 wherein the plurality of magnetic field generators produces a strongest magnetic field proximate the base end of each of the targets and a weakest magnetic field proximate the tip of each of the targets.

* * * * *